(12) United States Patent
Asano et al.

(10) Patent No.: US 8,060,854 B2
(45) Date of Patent: Nov. 15, 2011

(54) SEMICONDUCTOR DEVICE USING A PLURALITY OF HIGH-POTENTIAL-SIDE REFERENCE VOLTAGES

(75) Inventors: Takashi Asano, Gifu (JP); Shinji Furuichi, Maibara (JP)

(73) Assignee: Sanyo Electric Co., Ltd., Osaka (JP)

( * ) Notice: Subject to any disclaimer, the term of this patent is extended or adjusted under 35 U.S.C. 154(b) by 442 days.

(21) Appl. No.: 12/371,071

(22) Filed: Feb. 13, 2009

(65) Prior Publication Data

US 2009/0243401 A1    Oct. 1, 2009

(30) Foreign Application Priority Data

Mar. 28, 2008 (JP) ................................. 2008-087005

(51) Int. Cl.
*G06F 17/50* (2006.01)
(52) U.S. Cl. ......... 716/139; 716/101; 716/114; 716/126
(58) Field of Classification Search .................. 703/101, 703/114, 126, 139
See application file for complete search history.

(56) References Cited

U.S. PATENT DOCUMENTS

| 6,898,109 | B2 * | 5/2005 | Hirose et al. | ................... | 365/149 |
| 7,002,866 | B2 * | 2/2006 | Hirose et al. | ................... | 365/207 |

FOREIGN PATENT DOCUMENTS

JP    11-224901    8/1999

* cited by examiner

*Primary Examiner* — Thuan Do
(74) *Attorney, Agent, or Firm* — McDermott Will & Emery LLP

(57) ABSTRACT

A plurality of third fixed potential lines are wired in parallel. A group of high-potential-side fixed potential lines containing a first fixed potential line and a second fixed potential line are wired in a plurality at predetermined intervals in a direction perpendicular to the third fixed potential line. In a layout region, surrounded by a pair of adjacent third fixed potential lines and a pair of groups of adjacent high-potential-side fixed potential lines, where a first element or a second element is arranged, either one of the first fixed potential line and the second fixed potential line is wired between the pair of third fixed potential lines. In a layout region used for second elements, a second fixed potential line connecting a pair of second fixed potential lines contained respectively in a pair of groups of high-potential-side fixed potential lines that form the layout region is wired between a pair of third fixed potential lines that form the layout region.

20 Claims, 4 Drawing Sheets

SEMICONDUCTOR DEVICE USING A PLURALITY OF HIGH-POTENTIAL-SIDE REFERENCE VOLTAGES

CROSS-REFERENCE TO RELATED APPLICATIONS

This application is based upon and claims the benefit of priority from the prior Japanese Patent Application No. 2008-087005, filed on Mar. 28, 2008, the entire contents of which are incorporated herein by reference.

BACKGROUND OF THE INVENTION

1. Field of the Invention

The present invention relates to a semiconductor device using a plurality of high-potential-side reference voltages.

2. Description of the Related Art

A reduction in power consumption is required for an LSI (Large Scale Integration) mounted on electronic equipment. In particular, the reduction in power consumption is strongly required for LSIs mounted on battery-driven mobile devices for the purpose of securing the extended battery life. As one of methods for reducing the power consumed by the LSIs, a plurality of power supply voltages are used and a lower one of the plurality of supply voltages is used when parts, in the LSI where not so much precision is required, is to be controlled.

For example, a method has been proposed where a lower power supply voltage in the plurality of power supply voltages is used and thereby the amplitude of a clock signal is made small. A large portion of electric power consumed within the LSI is consumed as power for the charging and discharging of gate capacitances used for turning on and off gates of transistors by clock signals. The power consumed by the charging and discharging by the clock signals is proportional to the square of power supply voltage. Thus, the reduction in the amplitude of clock signal will be effective in the reduction of power consumed by the charging and discharging.

As described above, when circuitry having a plurality of power supply voltages mixed therein is to be designed, the layout of power supply lines is complex as compared with a case where a single type of power supply voltage is used. Depending on the wiring position, the degree of freedom in component arrangement may be deteriorated or increased area of circuitry may result.

As the power line is located farther away from the power supply, the power supply voltage level thereof deteriorates as compared with the original level. To reduce this adverse effect, there is a method where, for a circuit having the multiplicity of elements arranged therein, the power lines are arranged in a mesh topology.

SUMMARY OF THE INVENTION

A semiconductor device according to one embodiment of the present invention is a semiconductor device in which a first fixed potential line for supplying a first high-potential-side reference voltage, a second fixed potential line for supplying a second high-potential-side reference voltage, which is lower than the first high-potential-side reference voltage and a third fixed potential line for supplying a low-potential-side reference voltage are wired and in which both a first element configured to operate upon receipt of the first high-potential-side reference voltage and the low-potential-side reference voltage and a second element configured to operate upon receipt of the second high-potential-side reference voltage and the low-potential-side reference voltage are provided, wherein a plurality of the third fixed potential lines are wired in parallel, wherein a group of high-potential-side fixed potential lines containing the first fixed potential line and the second fixed potential line are wired in a plurality at predetermined intervals in a direction perpendicular to the third fixed potential line, wherein, in a layout region, surrounded by a pair of adjacent third fixed potential lines and a pair of groups of adjacent high-potential-side fixed potential lines, where the first element or the second element is arranged, either one of the first fixed potential line and the second fixed potential line is wired between the pair of third fixed potential lines, and wherein in a layout region used for the second element, a second fixed potential line connecting a pair of second fixed potential lines contained respectively in a pair of groups of high-potential-side fixed potential lines that form the layout region is wired between a pair of third fixed potential lines that form the layout region.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1:
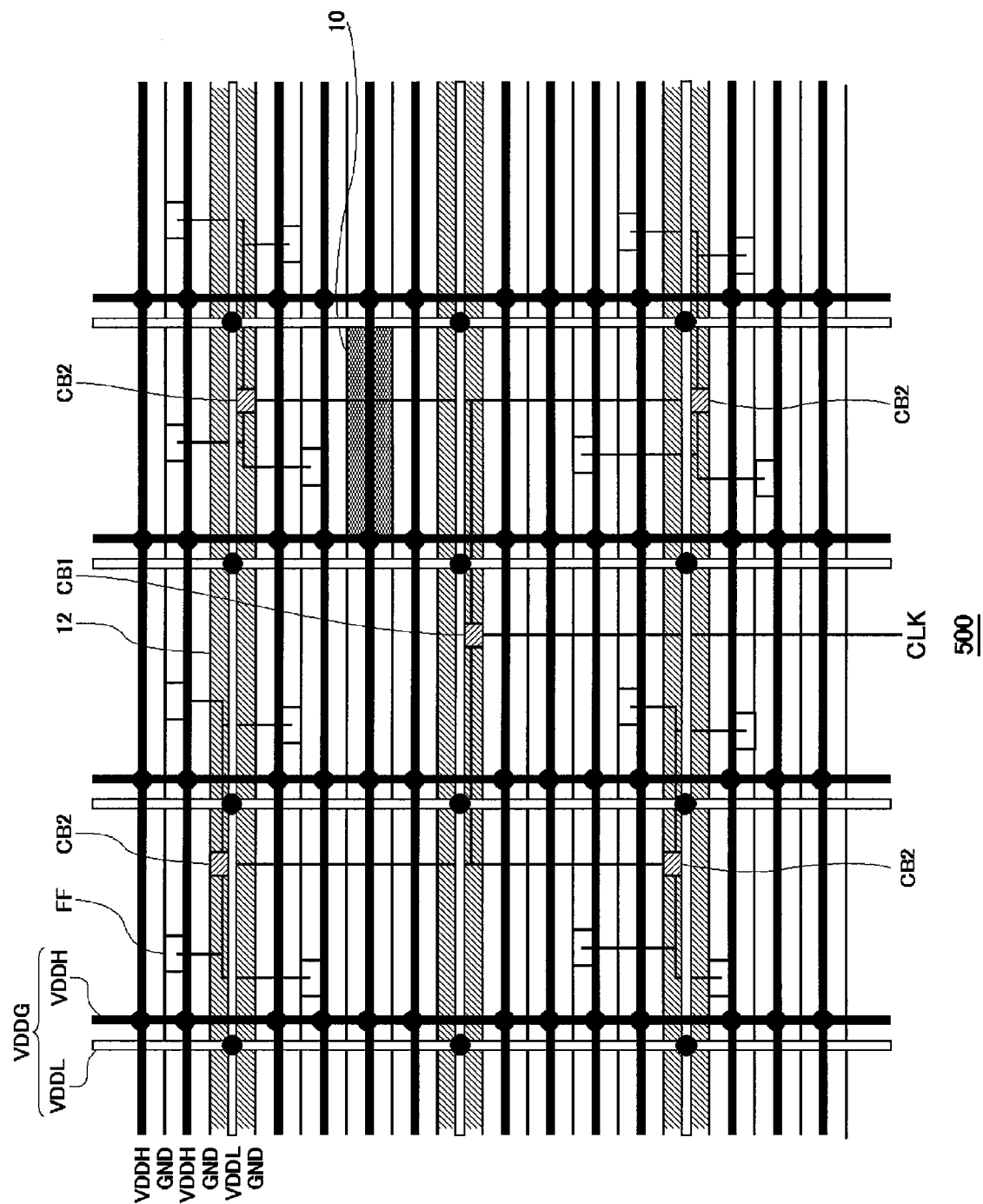
FIG. 1 shows a circuit configuration of a semiconductor device with which that according to the present embodiments is to be compared.

FIG. 1 shows a circuit configuration of a semiconductor device 500 with which that according to the present embodiments is to be compared. In this specification, the diagrams of semiconductor devices are depicted using circuit diagrams drawn by a design tool utilizing a cell library. It goes without saying that a technical concept, underlying the present embodiments, explained using the circuit diagrams drawn by the design tool is inherited to a packaging circuit.

A first fixed potential line for supplying a first high-potential-side reference voltage, a second fixed potential line for supplying a second high-potential-side reference voltage which is lower than the first high-potential-side reference voltage, and a third fixed potential line for supplying a low-potential-side reference voltage are wired into the semiconductor device 500. Both a first element configured to operate upon receipt of the first high-potential-side reference voltage and the low-potential-side reference voltage and a second element configured to operate upon receipt of the second high-potential-side reference voltage and the low-potential-side reference voltage are provided in the semiconductor device 500.

In the following examples, the first high-potential-side reference voltage is a first power supply voltage, the second high-potential-side reference voltage is a second power supply voltage, and the low-potential-side reference voltage is ground voltage. The second power supply voltage is one half of the first power supply voltage. A power supply line for supplying the first power supply voltage is denoted by a first power supply line VDDH, a power supply line for supplying the second power supply voltage is denoted by a second power supply line VDDL, and a power supply line for supplying the ground voltage is denoted by a ground line GND. In FIG. 1 to FIG. 4, the first power supply line VDDH, the second power supply line VDDL and the ground line GND are expressed by bold solid line, outline and thin solid line, respectively.

In the following examples, a first element is a device that operates on the first power supply voltage. The first element includes a sequential circuit such as a flip-flop FF. Though not shown in the Figures, the first element includes combinatorial circuits such as a logic gate, a selector and an adder. Flip-flops FF in the Figures, which are arranged among these various types of combinational circuits, hold data and adjust the synchronization.

A second element is a device that operates on the second power supply voltage. The second element includes a clock buffer CB. The clock buffer CB relays a clock signal CLK generated from a clock source and supplies the clock signal CLK to a flip-flop FF. For this clock signal CLK, a high-level side thereof is the second power supply voltage and a low-level side thereof is the ground voltage. The clock buffer CB may supply the clock signals CLK to not only the flip-flops FF but also other not-shown sequential circuits such as a counter.

The clock buffer CB takes charge of the following operations. If a clock source and an element to which the clock signal CLK is to be supplied are separated away from each other, the clock signal CLK will attenuate and therefore the capacity for driving the element will deteriorate. The clock buffer CB can restore the driving capacity. Also, the clock buffer CB, which includes an inverter, can generate a clock signal whose phase is opposite to that of the clock signal CLK. The first element such as a flip-flop FF receives the clock signal CLK from the clock buffer CB.

A description is now given in detail.

A plurality of ground lines GND are wired in parallel to one another in the semiconductor device 500. A first power supply line VDDH or a second power supply line VDDL is wired between adjacent ground lines GND. The ratio of the ground lines GND to the first power supply line VDDH or second power supply line VDDL in the wiring showing in FIG. 1 is 4:1.

A power supply line group VDDG that contains a first power supply line VDDH and a second power supply line VDDL is wired in a plurality at predetermined intervals in a direction perpendicular to the ground line GND. Here, each power supply line group VDDG contains a single first power supply line VDDH and a single second power supply line VDDL. Though first power supply lines VDDH and second power supply lines VDDL are disposed at right angles and formed in a mesh, each intersecting point between first power supply lines VDDH and each intersecting point between second power supply lines VDDL are conductive. In FIG. 1 to FIG. 4, circles filled in black indicate such intersecting points and are conductive there. It is obvious that each ground line GND is electrically shut off from either one of the first power supply line VDDH and the second power supply line VDDL.

A region, surrounded by a pair of adjacent ground lines GND and a pair of adjacent power line groups VDDG, where a first element or second element is arranged is hereinbelow called a layout region 10. The layout region 10 is formed in a matrix within the semiconductor device 500. In each layout region 10, either a first power supply line VDDH or a second power supply line VDDL is arranged between a pair of ground lines GND. Thus, in each layout region 10, two rows are formed where elements (cells defined by a library in each Figure) are to be arranged. Here, each row is a region interposed by a ground line GND and a first power line VDDH or a second power line VDDL. A first element is arranged in a layout region where the first power supply line VDDH is wired. A second element is arranged in a layout region 12 (left downward slanted lines in the Figures) where the second power line VDDL is wired.

In FIG. 1, a first power supply line VDDH or a second power supply line VDDL is continuously wired between ground lines GND. Thus, the same type of power line (namely, first power supply line VDDH or second power supply line VDDL) is wired for each layout region row in a direction where given ground lines GND extend. A first element can be provided in a layout region row where the first power supply line VDDH is wired, and a second element can be provided in a layout region row where the second power supply line VDDL is wired.

In FIG. 1, a plurality of clock buffers CB are so provided as to configure an H-shaped clock tree in layout regions 12 where second power supply lines VDDL are wired. To make a clock skew in each flop-flop FF smaller, the plurality of clock buffers CB are wired so that the length of wiring from a clock source to each flip-flop FF can be equal as much as possible. A first clock buffer CB1, which has received a clock signal CLK from a clock source, supplies the clock signal CLK to four second clock buffers CB2 provided around the first clock buffer CB1 in an H-shape. Each second block buffer CB2 supplies the clock signal CLK to four flip-flops FF provided around the each second block buffer CB2 in an H-shape. In this manner, each flip-flop FF receives a low-amplitude clock signal CLK from a clock buffer CB.

First Embodiment

Figure 2:
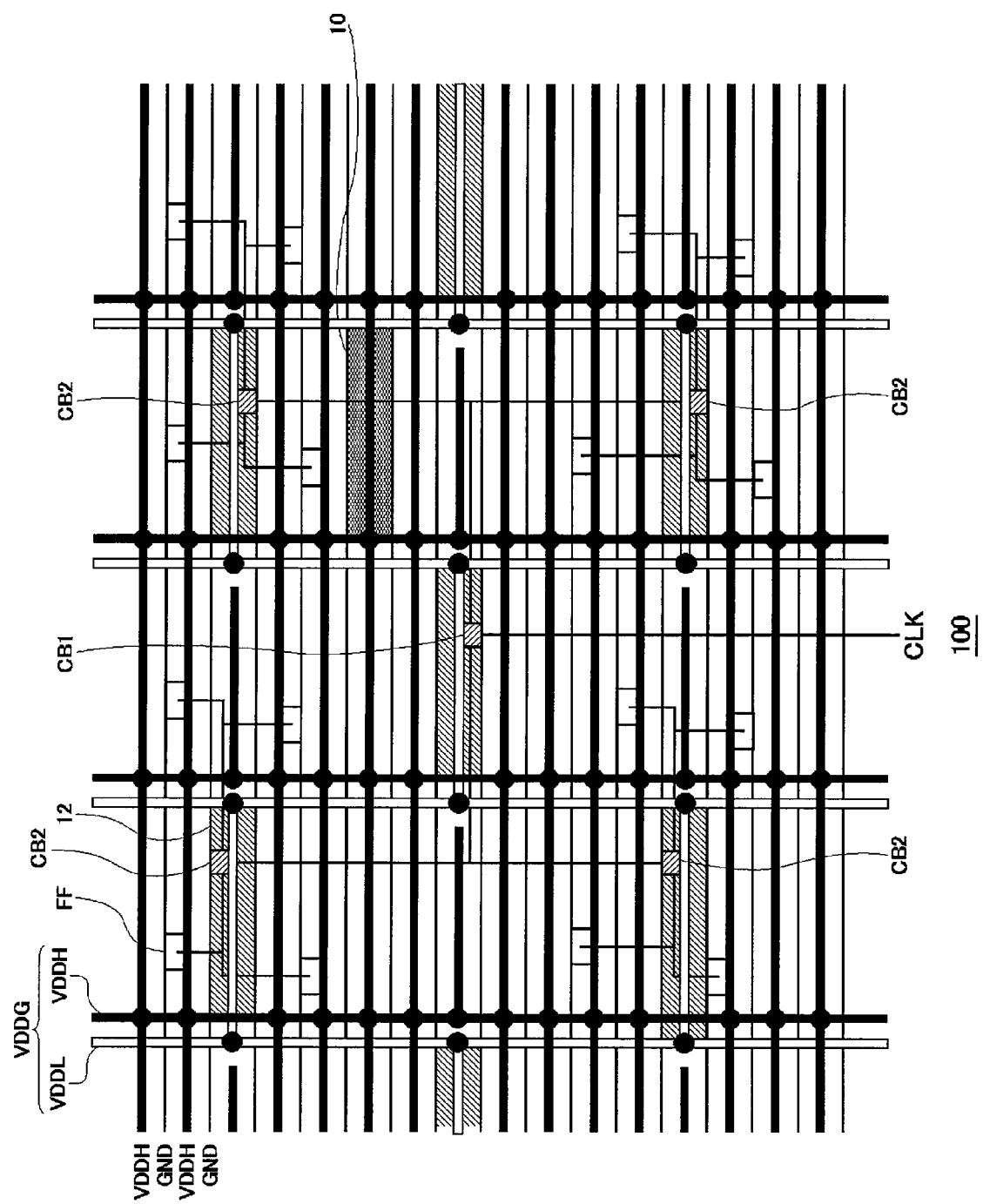
FIG. 2 shows a circuit configuration of a semiconductor device according to a first embodiment of the present invention.

FIG. 2 shows a circuit configuration of a semiconductor device 100 according to a first embodiment of the present invention. A description is given centering around different features from those of the semiconductor device 500 shown in FIG. 1.

According to this first embodiment, in a layout region 12 used for a second element, a second power supply line VDDL connecting a pair of second power supply lines VDDL is wired between a pair of ground lines GND that form the layout region 12. Here, the pair of second power supply lines VDDL are contained respectively in a pair of power supply groups VDDG that form the layout region 12. Hereinafter, a layout region 12 used for a second element will be simply referred to as "second-element layout region 12" also. Similarly, a layout region used for a first element will be hereinafter referred to simply as "first-element layout region" also.

The first embodiment differs from FIG. 1 in that in a layout region row, which contains second-element layout regions 12, disposed in a direction where ground lines GND extend, a first power supply line VDDH is wired between a pair of ground lines GND that form a layout region used for a first element (first-element layout region). In this first-element layout region, a first power supply line VDDH is branched out from one of first power supply lines VDDH contained in power supply line groups VDDG that form the layout region, in a direction perpendicular to said one of first power supply lines VDDH. The branched-out first power supply line VDDH is connected to a first power supply line VDDH contained in a power supply line group VDDG that can be branched out to a first-element layout region without crossing a second power supply line VDDL. In FIG. 2, said first power supply line VDDH is connected to a first power supply line VDDH contained in a power supply line group VDDG disposed left to the first-element layout region. One end of a first power supply line VDDH wired between a pair of ground lines GND that form the first-element layout region is open in FIG. 2. A configuration may be such that one end thereof is not open and said first power supply line VDDH in superposition with a second power supply line VDDL in the same direction is connected to a first power supply line VDDH contained in an adjacent power supply line group VDDG.

In each layout region row, in a direction where ground lines GND extend, which contains a second-element layout region 12, elements are arranged so that the elements contained in adjacent layout regions differ from each other. For example, a first element and a second element may be arranged alternately.

Second-element layout regions 12 are provided in houndstooth check pattern in a plurality of layout region rows, in the direction where ground line GND extend, which contain the second-element layout regions 12. More specifically, the second-element layout regions 12 are provided in a checkered pattern. In other words, a first-element layout region and a second-element region 12 are provided alternately for each layout region row. And when a given layout region row is compared with layout region rows disposed on the both sides of the given layout region row, the order in which first-element layout regions are disposed is opposite to the order in which second-element layout regions are disposed. It is to be noted that the arrangement of second-element layout regions 12 may not be completely in houndstooth check pattern and part of them may be omitted. Such omitted areas may be allocated to first-element layout regions.

In each layout region row, in a direction where ground lines GND extend, which does not contain the second-element layout region 12, a first power supply line VDDH is wired continuously between a pair of ground lines GND that form the layout region row. This layout region row is similar to that shown in FIG. 1.

According to the first embodiment as described above, first power supply lines VDDH and second power supply lines VDDL are wired in a mesh in a semiconductor that uses a plurality of power supply voltages. Thus, the power supply voltage can be supplied stably. Further, each flip-flop is driven by a low-amplitude clock signal having a second power supply potential in a high-level side and a ground voltage in a low level side. Hence, the power consumption can be reduced as compared with a case where a flip-flop is driven by a full-amplitude clock signal having a first power supply potential in the high-level side and the ground voltage in the low level side. Also, the signal which is subjected to an arithmetic operation is controlled by a first element that operates with a full-amplitude clock signal having the first power supply potential in the high level side and the ground voltage in the low level side. Thus, the signal accuracy can be maintained.

Further, in a first-element layout region in each layout region row, in a direction where ground lines GND extend, which contains a second-element layout region 12, a first power supply line VDDH is wired between a pair of ground lines GND. This configuration contributes to suppressing the increase in circuit area while the degree of freedom in design is assured.

In other words, in the case of FIG. 1, the layout region row containing a layout region 12 used for the second element allows the provision of second elements only. In contrast thereto, according to the first embodiment, a first element can be placed in said layout region row. As a result, the degree of freedom in design increases. In general, the number of first elements used is larger than that of second elements used, so that the first element layout region can be made larger as much as possible and the increase in circuit area can be minimized. The degree of freedom in design here indicates mainly the degree of freedom in arrangement of first elements.

Forming a second-element layout region 12 in houndstooth check pattern enables the designing of power supply lines to be simplified. The circuit arrangement in houndstooth pattern is suitable for occasions when a plurality of clock buffers CB forming an H-shaped clock tree are arranged.

Second Embodiment

Figure 3:
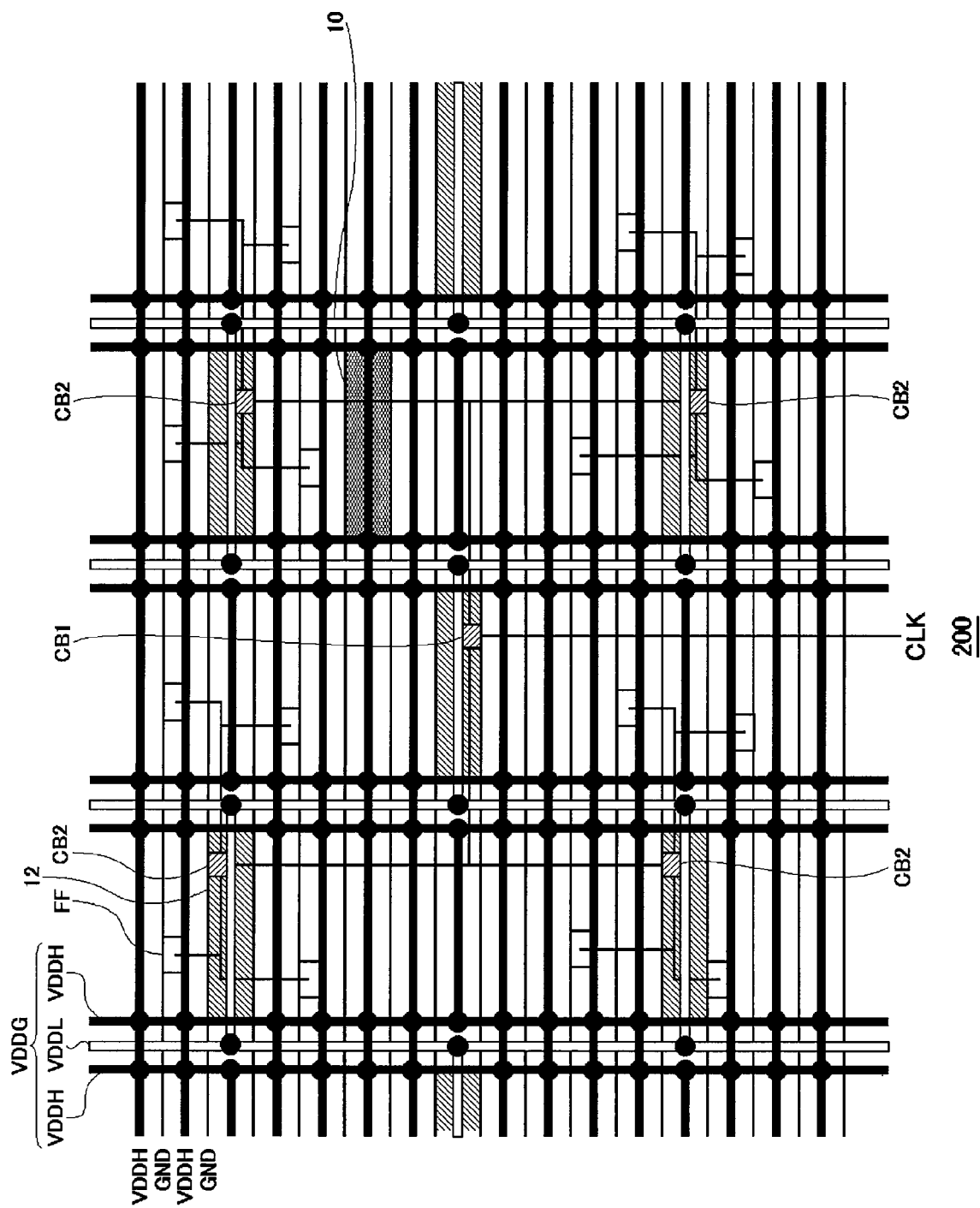
FIG. 3 shows a circuit configuration of a semiconductor device according to a second embodiment of the present invention.

FIG. 3 shows a circuit configuration of a semiconductor device 200 according to a second embodiment of the present invention. A description is given centering around different features from those of the semiconductor device 100 according to the first embodiment.

A power supply line group VDDG has a second power supply line VDDL in the center thereof and first power supply lines VDDH on the both sides of this second power supply line VDDL. In a first-element layout region in a layout region row, in a direction where ground lines GND extend, which contains a second-element layout region, a first power supply line VDDH connecting first power supply lines VDDH on the sides adjacent to said layout region is wired between a pair of ground lines GND that form said layout region. Here, the first power supply lines VDDH on the sides adjacent to said layout region are contained in a pair of power supply line groups VDDG that form said layout region.

According to the second embodiment, the same advantageous effects as those of the first embodiment are achieved. In addition, a first power supply line VDDH connecting a pair of first power supply lines VDDH on the sides adjacent to a first-element layout region is wired in the first-element layout region. Hence, a first power supply line VDDH can be wired in the first-element layout region without being overlapped with a second power supply line VDDL in the same direction. As a result, the first power supply voltage supplied from each first power supply line VDDH within the layout region can be stabilized as compared with the first embodiment. In the first embodiment, one end of the first power supply line VDDH must be open or the first power supply line VDDH in superposition with a second power supply line VDDL in the same direction must be connected to a first power supply line VDDH contained in an adjacent power supply line group VDDG.

Figure 4:
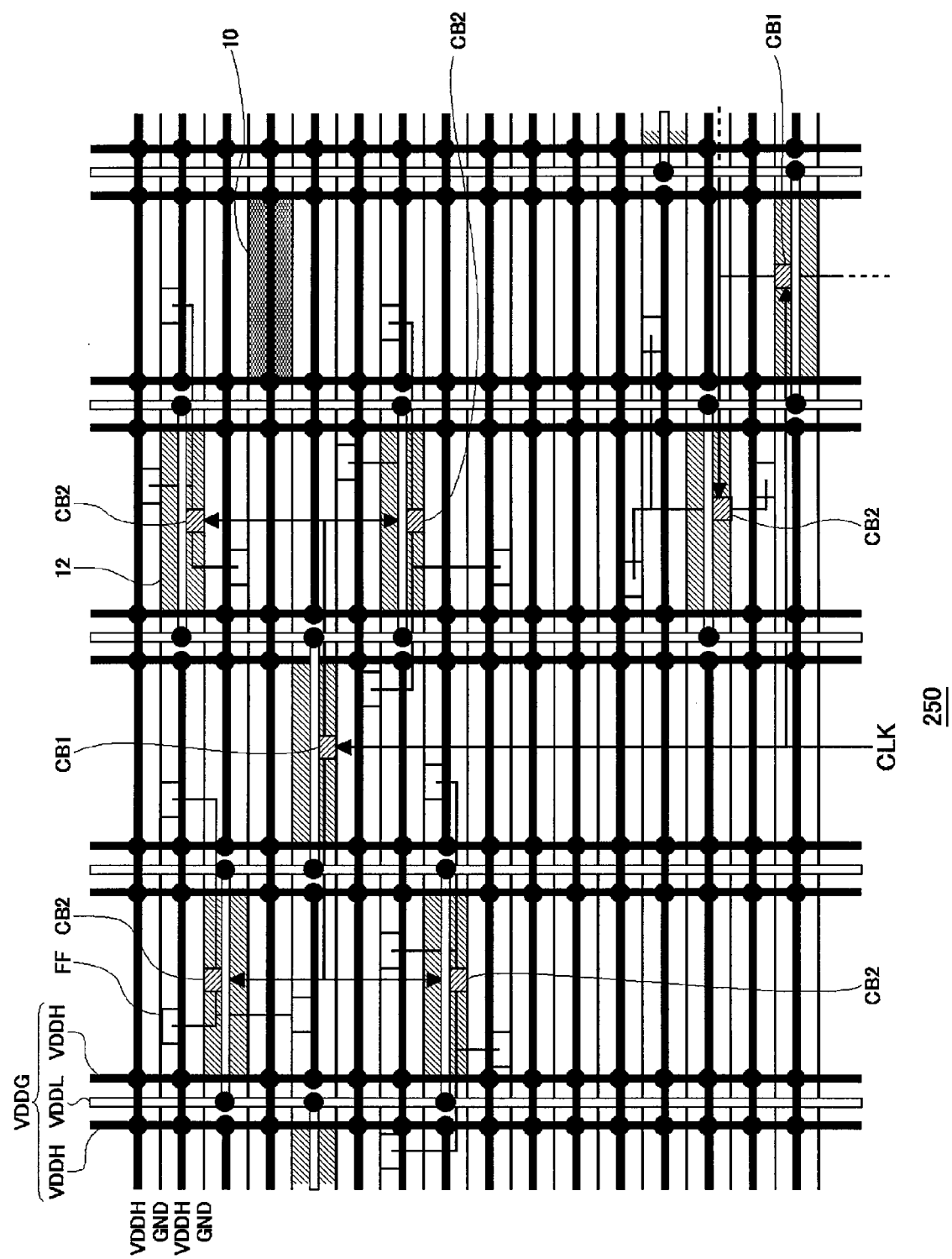
FIG. 4 shows a circuit configuration of a semiconductor device according to a modification of the second embodiment.

FIG. 4 shows a circuit configuration of a semiconductor device 250 according to a modification of the second embodiment. A description is given centering around different features from those of the semiconductor device 200 according to the second embodiment.

In FIG. 2 and FIG. 3, examples are shown where the layout regions 12 used for second elements are formed in houndstooth check pattern in a regular manner. In this modification, the second-element layout regions 12 are formed only on the regions where the second elements are actually provided. The flip-flop FF and the clock buffer CB are not placed in a lower-left region of FIG. 4. Thus, the second-element region 12 is not provided in that region.

According to the modification of the second embodiment, the same advantageous effects as those of the second embodiment are achieved. Compared with the second embodiment, the area for first-element layout regions can be maximized and thereby the degree of freedom in design can be further increased. This technical concept underlying this modification is also applicable to the first embodiment.

The present invention has been described based upon illustrative embodiments. These embodiments are intended to be illustrative only and it will be obvious to those skilled in the art that various other modifications to the combination of constituting elements and processes could be developed and that such modifications are also within the scope of the present invention.

For example, the first high-potential-side reference voltage, the second high-potential-reference voltage and the low-potential-side reference voltage are not limited to those described above and may be arbitrarily set by a designer.

In the embodiments described above, a description has been given of examples where a plurality of clock buffers CB that form an H-shaped clock tree are arranged. However, this should not be considered as limiting and the clock buffers CB may be arranged in a form other than the H-shape.

While the exemplary embodiments of the present invention and their modifications have been described using specific terms, such description is for illustrative purposes only, and it is to be understood that changes and variations may still be further made without departing from the spirit or scope of the appended claims.

What is claimed is:

1. A semiconductor device in which a first fixed potential line for supplying a first high-potential-side reference voltage, a second fixed potential line for supplying a second high-potential-side reference voltage, which is lower than the first high-potential-side reference voltage and a third fixed potential line for supplying a low-potential-side reference voltage are wired and where both a first element configured to operate upon receipt of the first high-potential-side reference voltage and the low-potential-side reference voltage and a second element configured to operate upon receipt of the second high-potential-side reference voltage and the low-potential-side reference voltage are provided,
wherein a plurality of the third fixed potential lines are wired in parallel,
wherein a group of high-potential-side fixed potential lines containing the first fixed potential line and the second fixed potential line are wired in a plurality at predetermined intervals in a direction perpendicular to the third fixed potential line,
wherein, in a layout region, surrounded by a pair of adjacent third fixed potential lines and a pair of groups of adjacent high-potential-side fixed potential lines, where the first element or the second element is arranged, either one of the first fixed potential line and the second fixed potential line is wired between the pair of third fixed potential lines, and
wherein in a layout region used for the second element, a second fixed potential line connecting a pair of second fixed potential lines contained respectively in a pair of groups of high-potential-side fixed potential lines that form the layout region is wired between a pair of third fixed potential lines that form the layout region.

2. A semiconductor device according to claim 1, wherein elements contained in adjacent layout regions differ from each other in a layout region row, in a direction where the third fixed potential line extends, which contains the layout region used for a second element.

3. A semiconductor device according to claim 2, wherein the layout regions used for second elements are provided in a checkered pattern in layout region rows, in a direction where the third fixed potential lines extend, which contain the layout regions used for second elements.

4. A semiconductor device according to claim 2, wherein the group of high-potential-side fixed potential lines has the second fixed potential line in the center and the first fixed potential lines on the both sides of the second fixed potential line, and
wherein, in the layout region used for a first element in a layout region row, in a direction where the third fixed potential line extends, which contains the layout region for a second element, a first fixed potential line connecting first fixed potential lines on the sides adjacent to the layout region is wired between a pair of third fixed potential lines that form the layout region, the first fixed potential lines on the sides adjacent to the layout region being contained respectively in a pair of groups of high-potential-side fixed potential lines that form the layout region.

5. A semiconductor device according to claim 2, wherein at least one of the second elements is a clock buffer, and
wherein at least one of the first elements receives a clock signal from the clock buffer.

6. A semiconductor device according to claim 5, wherein the clock buffer is provided in a plurality to configure a clock tree.

7. A semiconductor device according to claim 5, wherein at least one of the first elements is a flip-flop that receives the clock signal of the clock buffer.

8. A semiconductor device according to claim 1, wherein the layout regions used for second elements are provided in a checkered pattern in layout region rows, in a direction where the third fixed potential lines extend, which contain the layout regions used for second elements.

9. A semiconductor device according to claim 8, wherein the group of high-potential-side fixed potential lines has the second fixed potential line in the center and the first fixed potential lines on the both sides of the second fixed potential line, and
wherein, in the layout region used for a first element in a layout region row, in a direction where the third fixed potential line extends, which contains the layout region for a second element, a first fixed potential line connecting first fixed potential lines on the sides adjacent to the layout region is wired between a pair of third fixed potential lines that form the layout region, the first fixed potential lines on the sides adjacent to the layout region being contained respectively in a pair of groups of high-potential-side fixed potential lines that form the layout region.

10. A semiconductor device according to claim 8, wherein at least one of the second elements is a clock buffer, and
wherein at least one of the first elements receives a clock signal from the clock buffer.

11. A semiconductor device according to claim 10, wherein the clock buffer is provided in a plurality to configure a clock tree.

12. A semiconductor device according to claim 10, wherein at least one of the first elements is a flip-flop that receives the clock signal of the clock buffer.

13. A semiconductor device according to claim 1, wherein the group of high-potential-side fixed potential lines has the second fixed potential line in the center and the first fixed potential lines on the both sides of the second fixed potential line, and
wherein, in the layout region used for a first element in a layout region row, in a direction where the third fixed potential line extends, which contains the layout region for a second element, a first fixed potential line connecting first fixed potential lines on the sides adjacent to the layout region is wired between a pair of third fixed potential lines that form the layout region, the first fixed potential lines on the sides adjacent to the layout region being contained respectively in a pair of groups of high-potential-side fixed potential lines that form the layout region.

14. A semiconductor device according to claim 13, wherein at least one of the second elements is a clock buffer, and
wherein at least one of the first elements receives a clock signal from the clock buffer.

15. A semiconductor device according to claim 14, wherein the clock buffer is provided in a plurality to configure a clock tree.

16. A semiconductor device according to claim 14, wherein at least one of the first elements is a flip-flop that receives the clock signal of the clock buffer.

17. A semiconductor device according to claim 1, wherein at least one of the second elements is a clock buffer, and
wherein at least one of the first elements receives a clock signal from the clock buffer.

18. A semiconductor device according to claim 17, wherein the clock buffer is provided in a plurality to configure a clock tree.

19. A semiconductor device according to claim 17, wherein at least one of the first elements is a flip-flop that receives the clock signal of the clock buffer.

20. A semiconductor device according to claim 1, wherein the first high-potential-side reference voltage is a first power supply voltage,
wherein the second high-potential-side reference voltage is a second power supply voltage, and
wherein the low-potential-side reference voltage is ground voltage.

* * * * *